(12) United States Patent
Kelnberger et al.

(10) Patent No.: US 9,196,815 B2
(45) Date of Patent: Nov. 24, 2015

(54) FORCE MODULE WITH SUB-MODULES AND A CONTROLLING AND PROTECTION MODULE FOR GENERATING FORCES IN A HIGHLY DYNAMIC MANNER

(75) Inventors: Alfons Kelnberger, Bamberg (DE); Hans-Jürgen Schreiner, Hersbruck (DE); Reiner Bindig, Bindlach (DE); Jürgen Brandt, Sulzbach-Rosenberg (DE)

(73) Assignee: CeramTec GmbH, Plochingen (DE)

( * ) Notice: Subject to any disclaimer, the term of this patent is extended or adjusted under 35 U.S.C. 154(b) by 140 days.

(21) Appl. No.: 13/981,996

(22) PCT Filed: Feb. 23, 2012

(86) PCT No.: PCT/EP2012/053077
§ 371 (c)(1),
(2), (4) Date: Aug. 13, 2013

(87) PCT Pub. No.: WO2012/113869
PCT Pub. Date: Aug. 30, 2012

(65) Prior Publication Data
US 2013/0328445 A1  Dec. 12, 2013

(30) Foreign Application Priority Data
Feb. 24, 2011 (DE) .................. 10 2011 004 690

(51) Int. Cl.
*H01L 41/09* (2006.01)
*H01L 41/053* (2006.01)
*B21D 22/00* (2006.01)
*H01L 41/047* (2006.01)
*H02N 2/04* (2006.01)

(52) U.S. Cl.
CPC ............. *H01L 41/0536* (2013.01); *B21D 22/00* (2013.01); *H01L 41/0475* (2013.01); *H01L 41/053* (2013.01); *H02N 2/04* (2013.01)

(58) Field of Classification Search
CPC .... B06B 1/0622; B06B 1/0629; B06B 1/067; G10K 9/122; G10K 11/28
USPC ......... 310/311, 328, 330–332, 340, 348, 366, 310/322, 334
See application file for complete search history.

(56) References Cited

U.S. PATENT DOCUMENTS 4,271,371 A * 6/1981 Furuichi et al. .......... 310/316.01
5,000,415 A * 3/1991 Sandercock ................. 248/550

(Continued)

FOREIGN PATENT DOCUMENTS

DE          199 54 310 A1    5/2001
DE     10 2007 033 943 A1    1/2009
DE     10 2007 041 636 A1    3/2009

*Primary Examiner* — Thomas Dougherty
(74) *Attorney, Agent, or Firm* — Norton Rose Fulbright US LLP

(57) ABSTRACT

The invention relates to a force module (20) for generating forces in a highly dynamic manner by assembling a plurality of piezo actuators (1) for connecting to a voltage source. To enable the force module (20) to generate forces in the range of a few 100 kN in a highly dynamic and spatially resolved manner, according to the invention it is proposed that the force module (20) consists of at least two sub-modules (21), each having at least two piezo actuators (1) and their electrical contacting elements, and a controlling and protection module (16) for the piezo actuators (1) in the sub-modules (21), wherein all electric contacting elements of the sub-modules (21) are fed into the controlling and protection module (16).

14 Claims, 3 Drawing Sheets

(56) References Cited

U.S. PATENT DOCUMENTS

| | | | |
|---|---|---|---|
| 6,781,285 B1* | 8/2004 | Lazarus et al. | 310/332 |
| 7,129,623 B2* | 10/2006 | Chou et al. | 310/346 |
| 2004/0140738 A1* | 7/2004 | Seeley et al. | 310/348 |
| 2005/0248237 A1* | 11/2005 | Wierach | 310/365 |
| 2007/0052325 A1 | 3/2007 | Onoda et al. | |
| 2008/0202664 A1 | 8/2008 | Pletner et al. | |
| 2010/0044460 A1* | 2/2010 | Sauzade | 239/102.2 |
| 2013/0140955 A1* | 6/2013 | Chaggares et al. | 310/334 |
| 2013/0257226 A1* | 10/2013 | Nobles et al. | 310/327 |

* cited by examiner

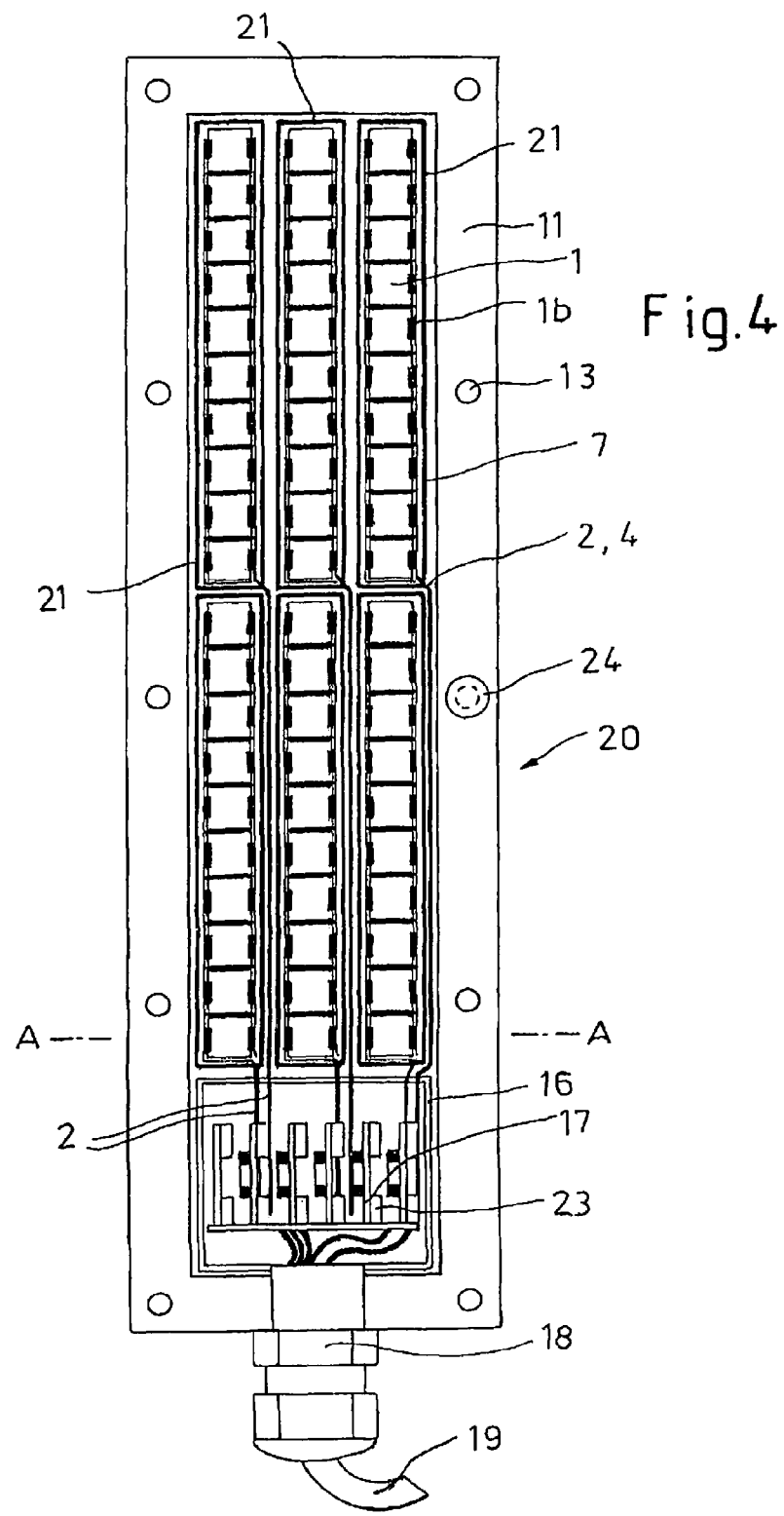

FORCE MODULE WITH SUB-MODULES AND A CONTROLLING AND PROTECTION MODULE FOR GENERATING FORCES IN A HIGHLY DYNAMIC MANNER

This application is a §371 of International Application No. PCT/EP2012/053077 filed Feb. 23, 2012, and claims priority from German Patent Application No. 10 2011 004 690.9 filed Feb. 24, 2011.

FIELD OF INVENTION

The invention relates to a force module for generating forces in a highly dynamic manner by assembling a plurality of piezo actuators for connecting to a voltage source and the use thereof.

BACKGROUND OF INVENTION

Piezo actuators in the form of piezoelectric low-voltage actuators, which are constructed in multi-layer design, are the current state of the art for generating forces in a highly dynamic manner. The working capability and therefore also the force capability are substantially determined by the volume of the piezo actuators which is subject to limits determined by the process. Forces which can typically be generated are of the order of magnitude of just a few kN.

Although higher forces can be achieved with piezo actuators in the form of the known high-voltage actuators which, on account of being constructed from discrete piezo discs, can be made significantly larger than piezoelectric low-voltage actuators, no spatial resolution can be achieved with these. Also, the high operating voltage does not allow them to be used in the harsh environment of mechanical engineering.

As relatively sensitive electro-ceramic materials are involved where piezo actuators are concerned, these cannot be used for the field of application according to the invention without further structural measures. Simply assembling several piezo actuators on one voltage source leads to uncontrolled electrical states (hot spots, serial failures due to the domino effect etc.).

SUMMARY OF INVENTION

Other systems based on hydraulic or electrodynamic principles either do not achieve the required high dynamics, the required spatial resolution or need high energy in order to maintain the forces. Special hydraulic cylinders are also eliminated on account of their too large installation dimensions.

The invention is based on the object of creating a force module which generates mechanical forces in the range of several 100 kN in a highly dynamic and spatially resolved manner. Response times which lie at least in the millisecond range are to be achieved and the spatial resolution is to take place at least in the square centimeter range.

It must also be possible to use the force module in an extremely demanding manufacturing environment, in which it is continuously subjected to and must be capable of withstanding external forces, in particular impact forces, of several 10 to 100 kN.

In order to guarantee a long life, the force module must also be reliably protected against environmental influences, for example moisture or chemical influences.

BRIEF DESCRIPTION OF THE FIGURES

FIG. 4 is a view of a force module according to the present invention along section B-B of FIG. 3.

DETAILED DESCRIPTION

Figure 1:
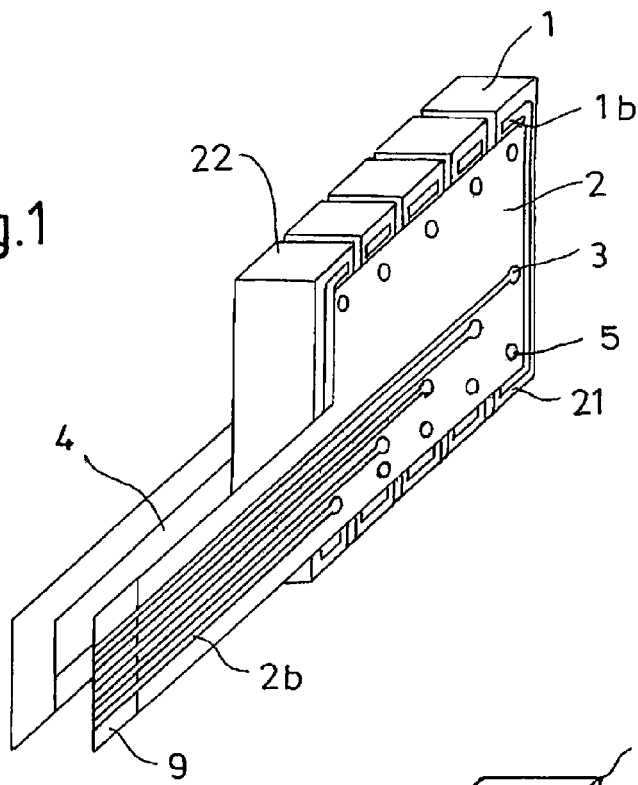
FIG. 1 shows the internal structure of a sub-module according to the present invention.

According to the invention, this object is achieved in that the force module consists of at least two sub-modules, each having at least two piezo actuators and their electrical contacting elements, and a controlling and protection module for the piezo actuators in the sub-modules, wherein all electric contacting elements of the sub-modules are fed into the controlling and protection module. As a result, the force capabilities of the individual piezo actuators are added together and the high total forces according to the object can be achieved.

In a preferred embodiment, the electrical contacting elements provide two electrical printed circuit tracks for each individual piezo actuator in the sub-module, enabling each piezo actuator in the sub-module to be driven individually and independently from others.

Preferably, the electrical contacting elements are a flexible board with electrical printed circuit tracks and the outer electrodes of the piezo actuators are electrically connected to the printed circuit tracks. Flexible boards are extremely thin and therefore require little space. In addition, they can be fed out of a housing easily and in a sealed manner. A flexible board is understood to mean a flexible, electrically insulating, flat, thin carrier to which printed circuit tracks are applied.

Preferably, each flexible board is provided with a connecting plug at its end. This simplifies the electrical coupling of the sub-modules to the controlling and protection module.

In a preferred embodiment, each sub-module is enclosed and has a housing part with base plate and cover in order to protect the piezo actuators from environmental influences, and only the electrical contacting elements are fed out of the housing in a sealed manner. By this means, the sub-module is reliably protected against environmental influences.

In a preferred embodiment, ceramic materials are introduced between the piezo actuators in the sub-modules. This leads to better electrical insulation of the individual piezo actuators from one another.

Preferably, all sub-modules are constructed identically. This simplifies production.

Preferably, no electronic components are mounted in the sub-modules and these are arranged exclusively in the controlling and protection module instead. This measure enables the sub-modules to be made small and compact.

In an embodiment, a power amplifier for each individual piezo actuator is arranged in the controlling and protection module. In this way, in addition to the protection, a power amplifier is also provided for each individual piezo actuator, in which the electrical powers/currents required for driving the individual piezo actuators are controlled by means of transistors. As the individual piezo actuators can be addressed individually, the force module is able to realize almost any dynamic force distributions.

The monitoring and control of the device is carried out by means of easily manageable control signals which are produced by a control unit, e.g. a computer, and fed into the controlling and protection module by means of a data bus, which constitutes a major advantage.

Preferably, the force module has a force module housing part with base plate and cover plate and all parts are made of steel, in particular hardened steel. By this means, the sensitive piezo actuators and the electronic components are permanently protected against high mechanical loads.

Preferably, the sub-modules in the force module housing part with the base plate and cover plate are pre-stressed by means of expansion screws, as a result of which no tensile forces are introduced into the piezo actuators.

Preferably, a connecting cable, the electrical conductors of which are fed into the controlling and protection module, is connected to the force module. Preferably, a bus cable is also fed into the controlling and protection module.

Preferably, the force module according to the invention is used for controlling flow processes by means of local clamping in mechanical forming processes in the automobile industry.

The invention is characterized in that a certain number of piezo actuators, in particular piezoelectric multi-layer actuators, are assembled to form a sub-module and these sub-modules are assembled and arranged in a defined manner to form a force module consisting of a plurality of sub-modules. As a result, the force capabilities of the individual piezo actuators are added together and high total forces can be achieved.

The piezo actuators in the sub-modules can be driven individually and independently of one another in a highly dynamic manner, as a result of which a high spatial resolution is achieved.

The sub-modules are structurally designed such that they guarantee the electrical insulation of the individual piezo actuators and ensure a reliable protection against environmental influences.

In addition to the sub-modules, the force module contains a controlling and protection module, with which the piezo actuators of the sub-modules are individually electrically driven and protected and in this way controlled and managed electrical states are achieved.

The force module is designed so that it guarantees the mechanical protection of the sub-modules and of the controlling and protection module against high impact loads in operation for example.

A possible embodiment of the invention consists in that the sub-modules contain ten piezoelectric multi-layer actuators which are arranged in a row and can be driven individually. A different arrangement with a different number of individual piezo actuators is, of course, also possible, e.g. in the form of a 3×3 or N×N matrix arrangement.

In this embodiment, the piezo actuators are standard actuators, such as those used in common rail diesel injectors for example.

Contact with the individual piezo actuators is achieved by means of flexible board printed circuit tracks, e.g. by means of flexible boards to which printed circuit tracks are applied, or similarly space-saving methods with which, at the same time, the connecting and assembly effort can also be significantly reduced. This constitutes a decisive advantage compared with conventional contact methods, for example with individual connecting leads.

The use of a plurality of sub-modules in the force module has the decisive advantage that, purely statistically, a relatively high output as well as a low probability of failure is ensured. Each individual sub-module is tested before installation in the force module.

As an example, with an output probability or probability of survival of the individual piezo actuator of 99%, the output probability or probability of survival in a system of N piezo actuators is $0.99^N$, that is to say with N=100, for example, only 37%. In a system of M sub-modules, it is therefore $0.99^M$. With M=10, it is a significantly higher 90%.

Furthermore, the electrical decoupling of the individual piezo actuators in the sub-module has the advantage that each piezo actuator can be driven singly and individually. This prevents a serial failure as a result of a domino effect.

In addition, the ability to check each individual piezo actuator, for example during assembly or in operation, is guaranteed. A failed piezo actuator in a sub-module can therefore be localized and at least partially compensated for, i.e. the functionality of the sub-module can be maintained by appropriate control of the other piezo actuators.

The piezo actuators can be checked by conventional methods, such as impedance or charge analysis for example.

The piezo actuators are arranged in a row on a base plate, for example made of hardened steel, of the sub-module and aligned thereon by means of suitable tools, thus ruling out incorrect positioning of individual piezo actuators.

For further enclosure of the piezo actuators, a housing part, which encloses the row of piezo actuators, is arranged on the base plate. As an example, this housing part consists of a folded sheet metal part and has a cutout for the flexible printed circuit tracks. A cover is located on the housing part, thus ensuring a complete enclosure or encapsulation of the piezo actuators overall.

For better electrical insulation of the individual piezo actuators with respect to one another within the sub-module, electrically insulating components or substances, for example made of ceramic materials, are fitted between the piezo actuators. In a preferred embodiment, these are thin plates made of aluminum oxide. However, they can also be other ceramic materials or ceramic particles which are incorporated in the casting compound, or separate films of materials with a high dielectric strength. In the event of a flashover of an individual piezo actuator, this has the advantage that the damage does not affect the adjacent piezo actuators and the sub-module remains functional, i.e. intact.

The piezo actuators in the sub-modules are encapsulated to protect against environmental influences, for example against chemical substances or moisture. Casting compounds, for example made of silicone, polyurethane or epoxy resin, are suitable for this purpose. The casting compound fixes base plate, piezo actuators, housing part and cover.

The sub-modules constructed in this way are electrically connected to the controlling and protection module, for example by flexible printed circuit tracks with integral connecting plugs. The separation of the sub-modules from the controlling and protection module has the decisive advantage that the sub-modules can be made very compact, as no additional electronic components, such as for example electrical protection (e.g. mini fuses, PTC elements, zener diodes or other protection elements), have to be fitted to the piezo actuators. The individual fusing of the piezo actuators, which is necessary to prevent a complete failure of the sub-module in the event of a failure of one piezo actuator, is therefore carried out in a separate modular unit.

In an embodiment, in addition to the protection, the controlling and protection module also contains a power amplifier for each individual piezo actuator, in which the electrical powers/currents necessary for driving the individual piezo actuators are controlled by means of transistors. The individual piezo actuators can be addressed individually and therefore the force module according to the invention is able to realize almost any dynamic force distributions.

The monitoring and control of the force modules is carried out by means of easily manageable control signals which are produced by a control unit, e.g. a computer, and fed to the controlling and protection module by means of a data bus, which constitutes a major advantage.

The associated circuit technology is based on the known principles of power amplifier technology.

In a simpler variant, one sub-module is in each case driven by one power amplifier. This simplifies the construction.

In an even simpler variant, the controlling and protection module contains only fuses and surge arresters. In this case, when the whole force module is driven as one unit or the individual sub-modules are driven, the individual control lines can be fed to the outside and an external power amplifier connected. However, it would then no longer be possible to address the piezo actuators individually.

According to the invention, the sub-modules and the controlling and protection module are combined to form one force module.

The invention is explained further below with reference to figures.

Figure 2:
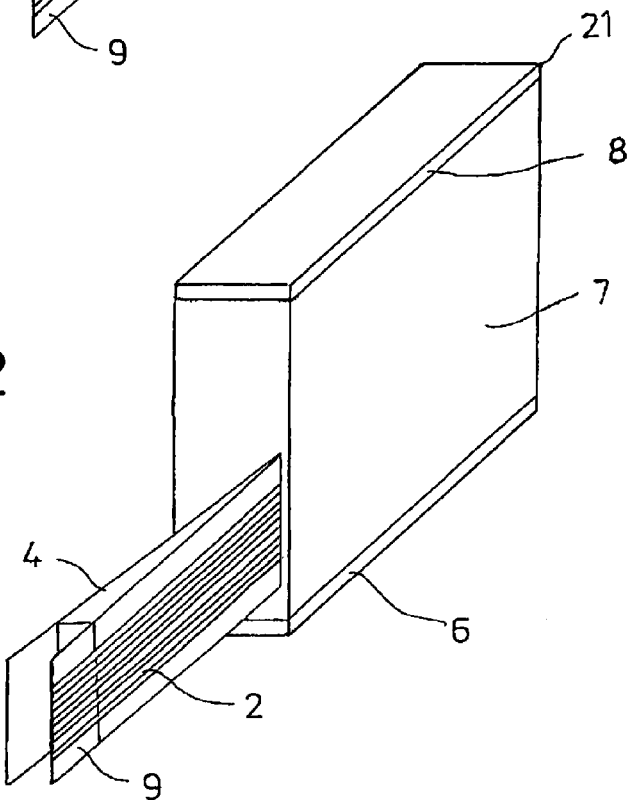
FIG. 2 is an external view of the sub-module of FIG. 1.

A sub-module 21 is shown in FIGS. 1 and 2, wherein FIG. 1 shows the internal structure and FIG. 2 an external view. In the embodiment shown here, five piezo actuators 1 are arranged in a row inside the sub-module 21. The internal electrodes (not shown) of each polarity of the piezo actuator are connected in parallel by means of external electrodes 1b. The piezo actuators 1 are all multi-layer actuators.

A flexible board 2 with printed circuit tracks 2b is in each case soldered to the external electrodes 1b of one polarity. Here, each external electrode 1b of each piezo actuator 1 is associated with a printed circuit track 2b on the flexible board 2. The solder connection (vias with through-connection) for electrically connecting the external electrodes 1b to the printed circuit track 2b is identified by the reference 3. The solder connection (vias with through-connection) for mechanically connecting the external electrodes 1b to the flexible board 2, i.e. the stabilizing of the piezo actuator/flexible board arrangement, is identified by the reference 5.

As well as the printed circuit tracks 2b, a ground connection 4 is also provided on the flexible board 2. Each flexible board 2 is arranged with a connecting plug 9 (shown only schematically here) at its end.

FIG. 2 shows a sub-module 21 from the outside. Each sub-module 21 is enclosed and consists of a housing part 7, a base plate 6 and cover 8. Only the flexible board 2 with the printed circuit tracks 2b is fed out of the housing, namely in a sealed manner, so that no environmental influences can find their way into the housing.

Figure 3:
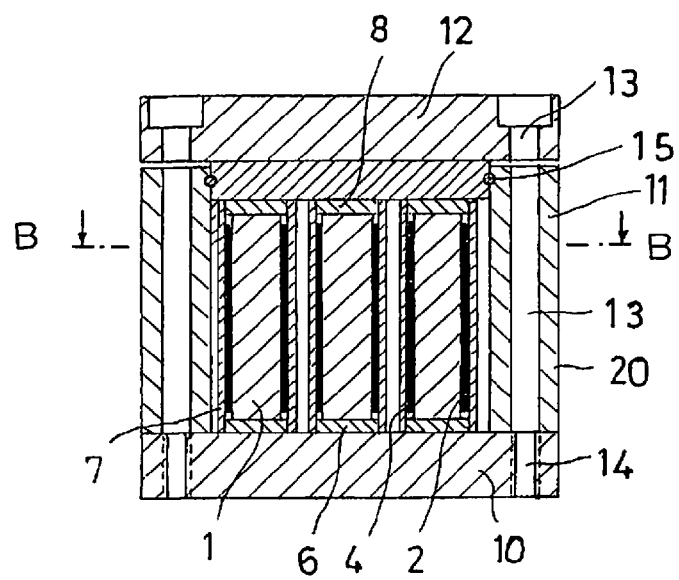
FIG. 3 is a view of a force module according to the present invention along section A-A of FIG. 4.

A force module 20 according to the invention is shown in FIGS. 3 and 4. FIG. 3 shows the section A-A of FIG. 4 and FIG. 4 shows the section B-B of FIG. 3.

The force module 20 consists of six sub-modules 21, which have been inserted or plugged into the housing of the force module 20, wherein in each case three sub-modules are arranged next to one another. Overall, this therefore results in a force module 20 with sixty piezo actuators 1. The individual sub-modules 21 are all in electrical contact with the controlling and protection module 16. More or fewer sub-modules 21 can of course also be combined in any way to form a force module 20.

The force module 20 has the task of permanently protecting the sensitive piezo actuators 1 and the electronic components in the controlling and protection module 16 against high mechanical loads and, in the exemplary embodiment, consists of a solid base plate 10 and cover plate 12 made of steel, for example hardened steel, and a likewise solid force module housing part 11.

The cover plate 12 is structurally designed so that it is fed through the force module housing part 11 during assembly. This is realized here by a peripheral recess. A sealing means, here an O-ring 15 which protects the force module housing part 11 against environmental influences, is additionally located in this recess.

Holes 13, which each have a thread 14 and are arranged uniformly around the periphery of the force module 20, are located in the cover plate 12, in the force module housing part 11 and in the base plate 10. In this exemplary embodiment, ten holes 13 are sufficient. They are used for accommodating expansion screws 24, with which the sub-modules 21 are pre-stressed in the force module 20 and by means of which the three components 10, 11, 12 of the housing are securely joined to one another.

The expansion screws 24 act with a constant force on the sub-modules 21, pre-stress these and prevent tensile forces being introduced into the piezo actuators 1. The sizing of the expansion screws 24 with regard to their stiffness and position must be chosen so that the piezo actuators 1 have a sufficiently high expansion.

As the piezo actuators 1 can have slightly different heights for process reasons, they must be compressed during the assembly of the force module 20. In doing so, the piezo actuators 1 themselves must not topple over and, at the end of the assembly process, must all be in firm contact with the cover plate 12 of the force module 20, as otherwise the functionality of the force module 20 will not be guaranteed.

Advantageously, the cover plate 12 is assembled in such a way that, in a first step, the cover plate 12 is carefully moved as far as the stop by means of a suitable press device, i.e. the cover plate 12 rests immediately on the force module housing part 11. The expansion screws 24 with defined stiffness which are fitted around the periphery of the force module are then tightened to a defined torque and the press device subsequently released. The piezo actuators spring back in the range of a few micrometers and an air gap is produced between cover plate 12 and force module housing part 11.

Advantageously, this provides ideal protection for the force module in the event of high mechanical loads, e.g. typical impact loads, which occur with metal forming processes. In the extreme case, the cover plate 12 goes as far as the stop position with the force module housing part 11, the air gap closes, thereby limiting the compression of the piezo actuators 1, and prevents them from being damaged.

The process of assembling the force module 20, in particular whether all piezo actuators are in force contact with the cover plate 12, can be checked by the impedance or charge monitoring method already mentioned.

The electrical circuit in the controlling and protection module 16 is designated by the reference 17, and the media-tight gland of the connecting cable 19 in the force module 20 by the reference 18. In an embodiment, a power amplifier 23 for each piezo actuator 1 (only indicated in a general way) can also be arranged in the controlling and protection module 16.

It is claimed:

1. A force module for generating forces in a highly dynamic manner by assembling a plurality of piezo actuators for connecting to a voltage source comprising:
    at least two sub-modules, wherein each sub-module comprises at least two piezo actuators and electrical contacting elements, and
    a controlling and protection module for the piezo actuators, wherein all electric contacting elements of the sub-modules feed into the controlling and protection module,
    wherein the electrical contacting elements are a flexible board with printed circuit tracks and outer electrodes of the piezo actuators are electrically connected to the printed circuit tracks.

2. A force module for generating forces in a highly dynamic manner by assembling a plurality of piezo actuators for connecting to a voltage source comprising:
    at least two sub-modules, wherein each sub-module comprises at least two piezo actuators and electrical contacting elements, and
    a controlling and protection module for the piezo actuators, wherein all electric contacting elements of the sub-modules feed into the controlling and protection module, wherein the electrical contacting elements provide two electrical printed circuit tracks for each individual piezo actuator in the sub-module, enabling each piezo actuator in the sub-module to be driven individually.

3. The force module as claimed in claim 2, wherein the electrical contacting elements are a flexible board with printed circuit tracks and outer electrodes of the piezo actuators are electrically connected to the printed circuit tracks.

4. The force module as claimed in claim 3, wherein each said flexible board is provided with a connecting plug at an end thereof.

5. The force module as claimed in claim 1, wherein each sub-module is enclosed and has a housing part with base plate and cover in order to protect the piezo actuators from environmental influences, and only the electrical contacting elements are fed out of the housing in a sealed manner.

6. The force module as claimed in claim 1, wherein a ceramic material is introduced between the piezo actuators in the sub-modules.

7. The force module as claimed in claim 1, wherein all said sub-modules are constructed identically.

8. The force module as claimed in claim 1, wherein no electronic components are mounted in the sub-modules and these are arranged exclusively in the controlling and protection module instead.

9. The force module as claimed in claim 1, wherein a power amplifier for each individual piezo actuator is arranged in the controlling and protection module.

10. The force module as claimed in claim 1, wherein the force module has a force module housing part with base plate and cover plate and all parts are made of steel.

11. The force module as claimed in claim 10, wherein the steel is hardened steel.

12. The force module as claimed in claim 10, wherein the sub-modules in the force module housing part with the base plate and cover plate are pre-stressed by means of expansion screws.

13. The force module as claimed in claim 1, wherein a connecting cable having electrical conductors, wherein said electrical conductors of said connecting cable are fed into the controlling and protection module, is connected to the force module.

14. A method of controlling flow processes by local clamping in a mechanical forming process by providing the control with the force module of claim 1.

* * * * *